United States Patent
Schaeffer, III et al.

(10) Patent No.: US 7,109,079 B2
(45) Date of Patent: Sep. 19, 2006

(54) METAL GATE TRANSISTOR CMOS PROCESS AND METHOD FOR MAKING

(75) Inventors: James K. Schaeffer, III, Austin, TX (US); Olubunmi O. Adetutu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/043,337

(22) Filed: Jan. 26, 2005

(65) Prior Publication Data

US 2006/0166424 A1    Jul. 27, 2006

(51) Int. Cl.
H01L 21/8238    (2006.01)
H01L 29/76    (2006.01)

(52) U.S. Cl. .................. 438/199; 438/595; 257/369

(58) Field of Classification Search ........... 438/199, 438/595; 257/369, 351
See application file for complete search history.

(56) References Cited

U.S. PATENT DOCUMENTS

| | | | |
|---|---|---|---|
| 6,255,698 B1 * | 7/2001 | Gardner et al. | 257/369 |
| 6,423,632 B1 | 7/2002 | Samavedam | |
| 6,444,512 B1 | 9/2002 | Madhukar | |
| 6,518,106 B1 | 2/2003 | Ngai | |
| 2004/0023478 A1 | 2/2004 | Samavedam | |
| 2005/0087870 A1 * | 4/2005 | Adetutu et al. | 257/751 |

OTHER PUBLICATIONS

Samavedam et al., "Dual-Metal gate CMOS with HfO$_2$ Gate Dielectric," IEEE IEDM Technical Digest, 2002, 4 pgs.
Cheng et al., "Metal Gates for Advanced Sub-80-nm SOI CMOS Technology," IEEE International SOI Conference, 2001, pp. 91-92.
Rhee et al., "A New Double-Layered Structure for Mass-Production-Worthy CMOSFETs with Poly-siGe Gate," IEEE 2002 Symposium On VLSI Technology Digest of Technical Papers, pp. 126-127.

* cited by examiner

Primary Examiner—Lex H. Malsawma
(74) Attorney, Agent, or Firm—Daniel D. Hill; Kim-Marie Vo

(57) ABSTRACT

A method for forming a semiconductor device (100) includes a semiconductor substrate (102) having a first region (104), forming a gate dielectric (108) over the first region, forming a conductive metal oxide (110) over the gate dielectric, forming an oxidation resistant barrier layer (111) over the conductive metal oxide, and forming a capping layer over the oxidation resistant barrier layer. In one embodiment, the conductive metal oxide is IrO$_2$, MoO$_2$, and RuO$_2$, and the oxidation resistant barrier layer includes TiN.

18 Claims, 4 Drawing Sheets

METAL GATE TRANSISTOR CMOS PROCESS AND METHOD FOR MAKING

CROSS-REFERENCE TO RELATED APPLICATION

The present application is related to a commonly assigned, co-pending application by Taylor et al. entitled, "Blocking Layer For Silicide Uniformity in a Semiconductor Transistor", and filed Dec. 18, 2003 as U.S. Ser. No. 10/739,684.

1. Field of the Invention

The present invention is related to the field of semiconductor fabrication and more particularly to gate metals for NMOS (n-channel metal oxide semiconductor) and PMOS (p-channel MOS) devices.

2. Related Art

In the field of CMOS (complementary metal-oxide semiconductor) fabrication, the use of gates containing both a metal and an oxide is being considered. In a dual metal gate process, a first metal is used to form the gate electrodes for PMOS devices while a second different metal is used to form the gate electrodes for NMOS devices. The reason for using differing metals is so that the work functions can be optimized for each type of device. Changes in work function will affect the threshold voltage ($V_T$). For PMOS devices, it is desirable for the work function to be close to the silicon valence band edge of 5.2 eV, whereas for NMOS devices it is desirable for the work function to be close to the silicon conduction band edge of 4.1 eV.

One problem with the use of a conductive metal oxide as a gate material is that the metal oxide may lose oxygen during high temperature annealing, i.e. over 450 degrees Celsius. The undesirable loss of oxygen causes the work function of the gate to change, thus changing the $V_T$ of the device.

Therefore, it would be highly desirable to have a fabrication process in which dual metal gates can be formed which are resistant to change during an anneal processing step.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, the present invention overcomes the previously described problem of the gate electrode losing oxygen during high temperature annealing by including an oxidation resistant barrier layer over the conductive gate oxide. A polysilicon capping layer is deposited over the oxidation resistant barrier layer so that the gate salicide process can be formed in a conventional manner.

These benefits and advantages will be more readily understood upon reading of the following detailed description when taken in conjunction with the respective illustrations. It is noted that the illustrations are not drawn to scale in all respects but accuracy in scale is not necessary for understanding the invention. Furthermore, there are likely to be other embodiments within the scope of the invention that are not specifically illustrated.

Figure 1:
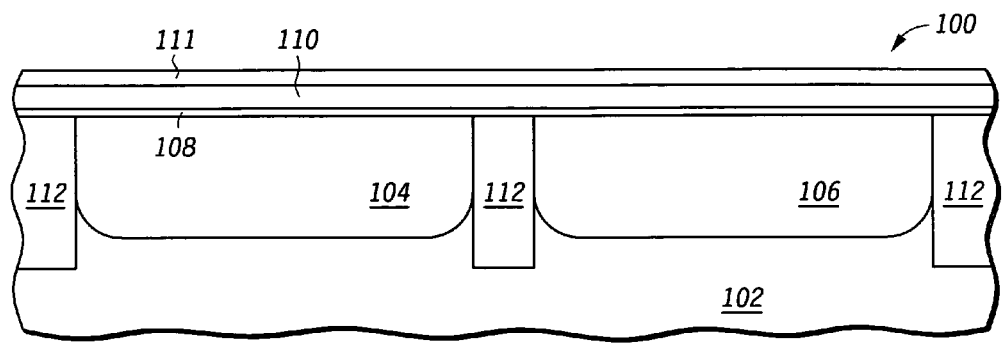
FIG. 1 is a partial cross sectional view of a partially completed semiconductor device according to one embodiment of the invention.

FIGS. 1–7 illustrate cross sectional views at various stages of one embodiment of a semiconductor process according to the present invention. In FIG. 1, a partially completed semiconductor device 100 is illustrated. Semiconductor device 100 as depicted in FIG. 1 includes a semiconductor substrate 102 into which a first well 104 and a second well 106 have been formed. Typically, semiconductor substrate 102 includes a lightly doped n-type or p-type single crystal silicon, but other semiconductor materials such as silicon, Germanium, and silicon-on-insulator (SOI) may be used. The depicted embodiment of semiconductor device 100 is fabricated with a twin well process in which first well 104 is selectively implanted into portions of substrate 102 where devices of a first conductivity type will be formed while second well 106 is selectively implanted into regions of substrate 102 into which transistors of a second different and opposite conductivity type will be formed. In one embodiment of the twin well process, the first well 104 may itself be enclosed within a tub (not depicted) in which the conductivity type of first well 104 and the tub are opposite. In another embodiment, substrate 102 may include a lightly doped epitaxial layer formed over a heavily doped bulk. In one embodiment, for example, the depicted portion of substrate 102 is a p– epitaxial layer formed over a p+ bulk, while first well 104 is doped n-type while second well 106 is p-type. N-type conductivity structures may be formed by implanting semiconductor substrate 102 with a suitable n-type impurity such as phosphorus or arsenic while p-type structures may be formed by implanting with a suitable p-type impurity such as boron. First well 104 and second well 106, as depicted in FIG. 1, are isolated from one another with trench isolation structures 112. Trench isolation structures 112 may comprise a suitable insulator such as a dielectric material. Trench isolation structures 112 may include an oxide, nitride, or other suitable electrical insulator material. In a preferred embodiment, trench isolation structures 112 comprise silicon dioxide.

A gate dielectric 108 is formed over first and second wells 104 and 106 of substrate 102. In one embodiment, gate dielectric 108 comprises a conventional, thermally formed silicon dioxide or silicon oxynitride with a thickness of preferably less than 10 nanometers. In another embodiment, gate dielectric 108 may comprise an alternative gate material such as a first or second transition metal oxide or rare earth oxide material. Such alternative gate dielectric materials are suitable for their high dielectric constant (K), which enables the use of a thicker gate dielectric layer without adversely affecting the electrical and capacitive characteristics of the film. One preferred high K gate dielectric is hafnium oxide ($HfO_2$). For these alternative gate dielectrics, suitable transition metal oxide composites selected from oxides of zirconium, hafnium, aluminum, lanthanum, strontium, tantalum, titanium, silicon and the combinations thereof may be used. Transition metal silicates and aluminates may also be used for the gate dielectric, such as hafnium silicate ($Hf_xSi_yO_z$), hafnium aluminate ($Hf_xAl_yO_z$), and hafnium titanate ($Hf_xTi_yO_z$).

As further depicted in FIG. 1, a conductive metal oxide 110 of a first metal type is deposited over gate dielectric 108. As described in greater detail below, first metal 110 will be selectively removed from portions of semiconductor substrate 102 in which transistors of one conductivity type are fabricated such that conductive metal oxide 110 will exist only where transistors of the other conductivity type are located. Preferably, conductive metal oxide 110 is deposited with a chemical vapor deposition (CVD), atomic layer deposition (ALD), or molecular beam deposition (MBD) process to protect the integrity of gate dielectric 108. In an alternative embodiment, first metal 110 may be physical vapor deposited with a sputter process. In embodiments in which conductive metal oxide 110 will ultimately remain on p-type transistors (i.e. when a PMOS device is to be formed in the left-half of device 100 as illustrated in FIG. 1), it is desirable that the first metal type has a work function that is close to the valence band of silicon (i.e. a work function of approximately 5.1 eV) when substrate 102 is silicon. The conductive metal oxide 110 includes an element selected from the group consisting of Ir, Mo, Ru, W, Os, Nb, Ti, V, Ni, and Re.

After depositing layer 110, an oxidation resistant barrier layer 111 is deposited over layer 110 by physical vapor deposition (PVD), chemical vapor deposition (CVD), and atomic layer deposition (ALD). The barrier layer 111 may have a thickness of between one nanometer (nm) to 50 nm. Barrier layer 111 should be resistant to forming a continuous insulating oxide layer where the oxygen source is the conductive oxide gate electrode. At elevated temperatures, conductive oxide gate electrodes may lose oxygen to surrounding films. The elevated temperatures may be due, for example, to a high temperature anneal, deposition, or other process step. If gate electrode material loses too much oxygen, the work function of the gate electrode can change. Additionally, if the conductive metal oxide loses oxygen to a subsequent formed layer, such as for example, polysilicon, then an insulating dielectric layer can form between the barrier layer 111 and the polysilicon. The insulating layer can cause an undesired capacitance to be formed between the gate material and polysilicon cap. The oxidation resistant barrier layer 111 forms a barrier between the conductive metal oxide and the layer above the barrier layer 111. The oxidation resistant barrier layer 111 blocks the diffusion of oxygen from the conductive metal oxide 110 and is also resistant to oxidation caused by contact between the barrier layer 111 and the conductive metal oxide 110.

Note that barrier layer 111 is used in the formation of a PMOS device in the illustrated embodiment. However, those skilled in the art will realize that a barrier layer similar to the barrier layer 111 may be included in the formation of an NMOS device.

Figure 2:
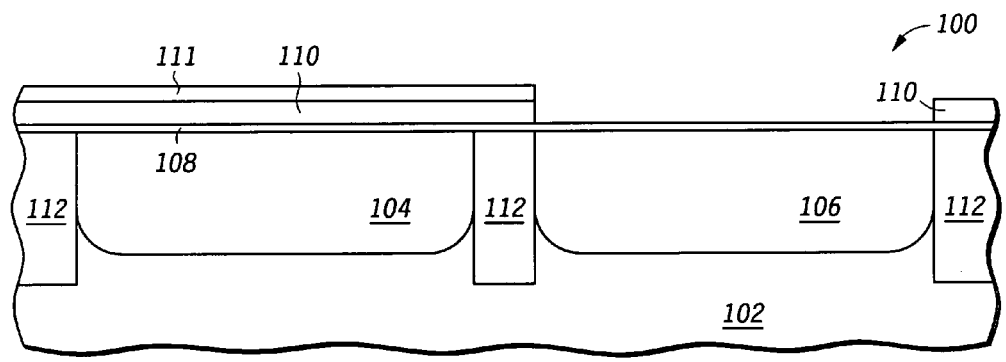
FIG. 2 is a processing step subsequent to FIG. 1 in which a conductive metal oxide and barrier layer is selectively removed from portions of the semiconductor device.

Turning now to FIG. 2, a portion of conductive metal oxide 110 and oxidation resistant 111 has been selectively removed using a wet or dry etch. In the depicted embodiment, the selective removal of layers 110 and 111 is accomplished with a mask and etch process using the well mask used to form second well 106. In this embodiment, conductive metal oxide 110 and oxidation resistant barrier layer 111 are removed over second well 106 (over which transistors of the second type will ultimately be fabricated). Thus, after transistor formation is completed, conductive metal oxide 110 and barrier layer 111 will remain in the structure of transistors of a first conductivity type while conductive metal oxide 110 and barrier layer 111 will not be present in transistors of the second conductivity type. The use of a critical dimension (CD) tolerant mask to define the portions of conductive metal oxide 110 and barrier layer 111 selectively removed as shown in FIG. 2 is not required because misalignment of the mask will not adversely affect subsequent processing.

In a preferred embodiment, a silicon oxide or silicon nitride hard mask (not shown) is used to pattern layer 110 and barrier layer 111 because many suitable metal etches used to remove layers 110 and 111 from the region of the second conductivity type (i.e. from over second well 106) will also etch or degrade a photoresist mask. Therefore, a mask which can sufficiently withstand the metal etch is needed. The hard mask can be patterned using the same mask used to form the second well 106. Layers 110 and 111 are also removed without damage to underlying gate dielectric 108, which can be accomplished with appropriate wet, plasma, or gaseous etches.

Figure 3:
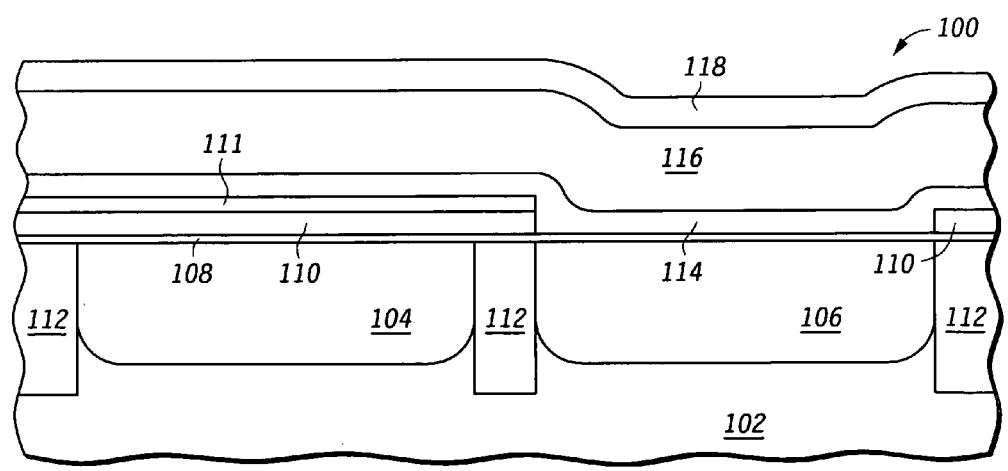
FIG. 3 is a partial cross sectional view subsequent to FIG. 2 in which a second gate metal, a polysilicon capping layer, and an ARC are deposited over the first gate metal.

Turning now to FIG. 3, a metal 114 is formed over the first and second wells 104 and 106 of semiconductor substrate 102 thereby covering barrier layer 111 and exposed portions of gate dielectric 108. Metal 114 is of a metal type that has a different work function than the type of metal used for conductive metal oxide 110. In embodiments where the metal type used for conductive metal oxide 110 has a work function that is close to the valence band of the substrate material (e.g. silicon), the metal type used for metal 114 has a work function closer to the conduction band of the substrate material. Conversely, in embodiments where the metal type used for conductive metal oxide 110 has a work function that is close to the conduction band of the substrate material, the metal type used for metal 114 has a work function that is close to the valence band of the substrate material.

As also depicted in FIG. 3, a silicon containing layer 116, which is either deposited as a conductive material or subsequently is made to be conductive, is deposited over metal 114. In a preferred embodiment, silicon containing layer 116 is a polysilicon layer or a polysilicon-germanium layer which is either in-situ doped or subsequently doped to be sufficiently conductive for, e.g., a gate electrode application. Silicon containing layer 116 may also be a doped or undoped amorphous silicon or silicon-germanium layer.

Preferably metal 114 is deposited to approximately the same thickness as conductive metal oxide 110, with each metal layer being in the range of 10–1000 angstroms (1–100 nanometers) thick. Silicon containing layer 116 is preferably deposited to a thickness in the range of 100–1500 angstroms (10–150 nanometers). The silicon containing layer thickness is not critical, but the thicker it is the more margin there will be in a subsequent spacer formation process, as described below. The thickness of the silicon containing layer can be the variable thickness layer of the gate stack. In other words, if a particular gate structure should be limited or targeted to a particular total thickness, the silicon containing layer can be the layer whose thickness is varied to achieve that thickness.

An anti-reflective coating (ARC) 118 is deposited over silicon containing layer 116. ARC 118 is preferably a silicon-rich silicon nitride layer, an organic ARC, a silicon-oxy nitride, or any ARC material which serves an ARC function for the particular lithography process. In a preferred embodiment, the ARC is deposited by conventional techniques to be between about 1 nm and 20 nm thick.

Figure 4:
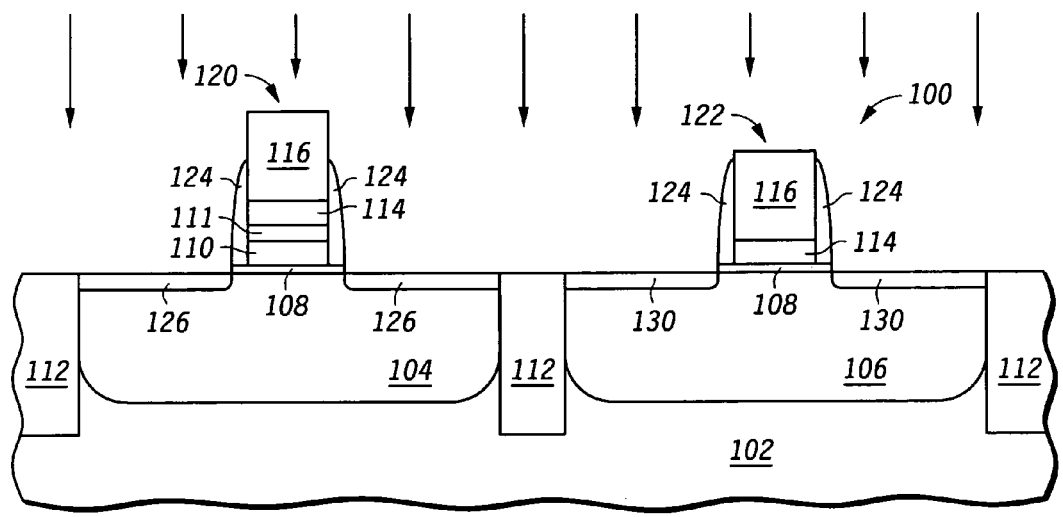
FIG. 4 is a processing step subsequent to FIG. 3 in which the deposited metals are patterned into gate structures and first spacers are formed adjacent the gate structures.

Turning now to FIG. 4, semiconductor device 100 is depicted after a gate mask and etch process have been performed to pattern conductive metal oxide layer 110, barrier layer 111, metal layer 114, and silicon containing layer 116, resulting in the formation of a first gate 120 over first well 104 and a second gate 122 over second well 106. First gate 120 includes a layer 110 on gate dielectric 108, barrier layer 111 on layer 110, and a second metal 114 formed on barrier layer 111. In contrast, second gate 122 includes second metal 114 in contact with gate dielectric 108. Both the first gate 120 and second gate 122 have an overlying cap formed of silicon containing layer 116. ARC layer 118 is initially also patterned during the gate stack etch but it can be fully removed after the gate etch, and thus is not shown in FIG. 4. Because silicon containing layer 116 serves to protect the metal gates during subsequent etches and cleans, there is no need to keep an ARC layer on top of the gates. This is advantageous in that the ARC need not later be separately etched during a contact etch process to form a contact to the gate, and instead can be wet etched. Furthermore, complete removal of the ARC enables a more robust silicidation process on top of the gate.

The gates 120 and 122 are simultaneously patterned with photoresist, and then etched. Because the gates have different heights, the gate etch chemistry should be selected to etch the gates down to the gate dielectric 108 as illustrated in FIG. 4. In the illustrated embodiment the gate etch does not remove the gate dielectric 108.

Continuing with FIG. 4 after patterning first gate 120 and second gate 122, first spacers 124 are formed along sides of both gates. In a preferred embodiment, first spacers 124 are formed by depositing a thin layer of silicon nitride (100–300 angstroms or 10–30 nanometers) and then anisotropically etching the wafer so that the silicon nitride is left only along the sidewalls of the gates. As a result of the etch, the resulting spacers will have tapered shaped, as shown in FIG. 4, having a maximum thickness or width near the bottom each gate of about 50–200 angstroms (5–20 nanometers). In the illustrated embodiment, first spacers 124 serve to protect the metal gates from being etched during subsequent removal of an implant mask. As mentioned previously, conventional piranha and SC-1 cleans used to strip photoresist masks also attack many metals being proposed for metal gates. In another embodiment, the spacers 124 may be eliminated.

As illustrated in FIG. 4, the height of first spacers 124 relative to the total height or thickness of the gates may vary. For example, first spacers 124 rise higher along the sidewall of second gate 122 as compared to first gate 120. This is not a problem because the presence of silicon containing layer 116 provides sufficient protection for the metal gates during subsequent etches because silicon containing layer 116 is resistant to attack from these etches. Thus, the process has a large process margin for variations in topography and gate stack heights due the presence of silicon containing layer 116. As long as the spacers cover all of the sidewalls of the underlying metals beneath silicon containing layer 116, the gate stack will be adequately protected.

After formation of first spacers 124, unprotected portions of gate dielectric 108 (e.g. portions other than beneath first gate 120, second gate 122, and first spacers 124) are removed if the dielectric is a high K dielectric (e.g. K greater than 3.9). For lower K values, e.g. in the case of silicon dioxide, the gate dielectric may remain. Removal of the gate dielectric can be accomplished using either dry or wet chemistries, or by annealing to convert the material to a volatile species, depending on the particular dielectric material used.

Next, extension regions 126 and 130 are formed self-aligned to first gate 120 and second gate 122, respectively, as also shown in FIG. 4. Extension regions are formed in MOS transistor structures as extensions to the source and drain regions to prevent short channel effects. Because the extension regions 126 and 130 will be of two different conductivity types (with extension regions 126 being of the first conductivity type and extension regions 130 being of the second conductivity type), a mask is needed to mask off a portion of the device during each implant step. For example, the portion of the device associated with second well 106 is masked off during formation of extension regions 126 and the portion of the device associated with first well 104 is masked off during formation of extension regions 130. The masks used during the implantation steps may be conventional photoresist masks. As mentioned previously, removal of photoresist masks at this stage in conventional dual metal gate processes can be harmful because the cleaning solutions may attack the gate metal. However, in accordance with the invention, the combination of first spacers 124 and silicon containing layer 116 enable the implant masks to be easily removed with conventional cleaning chemistries, such as piranha and SC-1 without harmful affects on the metal gates themselves.

Although not illustrated, halo implants may also be performed at this point in accordance with conventional practices. Again, implant masks need to be used and removal of these masks can be readily achieved without harm to metal gate materials by practicing the present invention.

Figure 5:
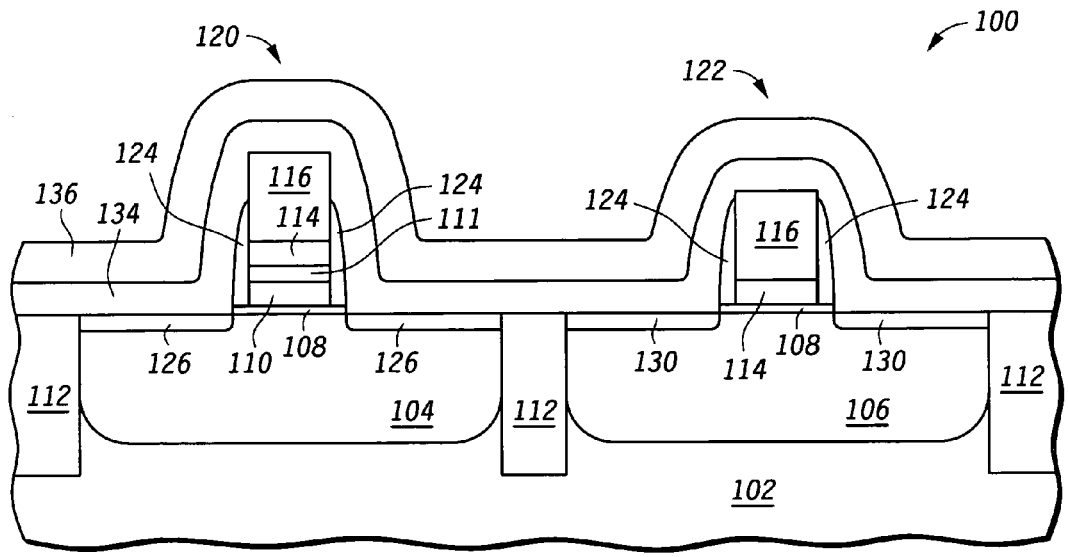
FIG. 5 is a processing step subsequent to FIG. 4 in which an oxide layer and a nitride layer are deposited over substrate, including over the gate structures and first spacers.

Referring to FIG. 5, after extension regions 126 and 130 are formed, an oxide liner 134 is deposited over the device, including over first gate 120 and second gate 122 and first spacers 124. A layer 136 is formed over oxide liner 134. Oxide liner 134 is generally about 50–250 angstroms (5–25 nanometers) thick, while layer 136 is generally 100–1000 angstroms (10–100 nanometers) thick. Oxide liner 134 is preferably formed of silicon dioxide and layer 136 is preferably silicon nitride, but may be of another material that can be etched sufficiently selective to oxide liner 134 and that does not react with a silicide forming metal (if the gates or source/drain regions of the transistors will be silicided).

Figure 6:
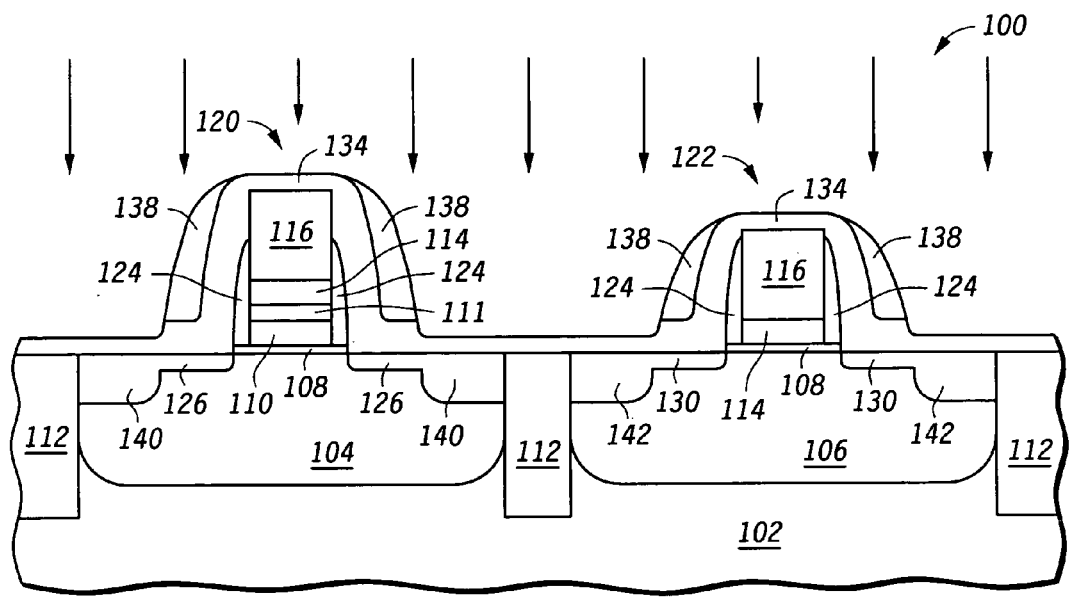
FIG. 6 is a processing step subsequent to FIG. 5 in which second spacers are formed from the nitride layer while simultaneously thinning the oxide layer, and subsequently the source/drain regions are formed.

As illustrated in FIG. 6, layer 136 is anisotropicly etched to form second spacers 138 without completely removing oxide liner 134. This can be accomplished with a combination of silicon dioxide and silicon nitride and using a conventional dry etch chemistry of $CF_4$, HBr and Ar. The oxide liner 134 may be thinned during formation of spacers 138, but this is not detrimental as long as the underlying substrate material (e.g. silicon) is not exposed at this point in the process.

As also shown in FIG. 6, source/drain regions are formed in a self-aligned manner in device 100 by implantation after formation of spacers 138 through the thinned oxide liner 134. Source/drain regions 140 are formed as part of the transistor which includes first gate 120 while source/drain regions 142 are formed as part of the transistor which includes second gate 122. The source/drain regions are formed using conventional implantation techniques.

Figure 7:
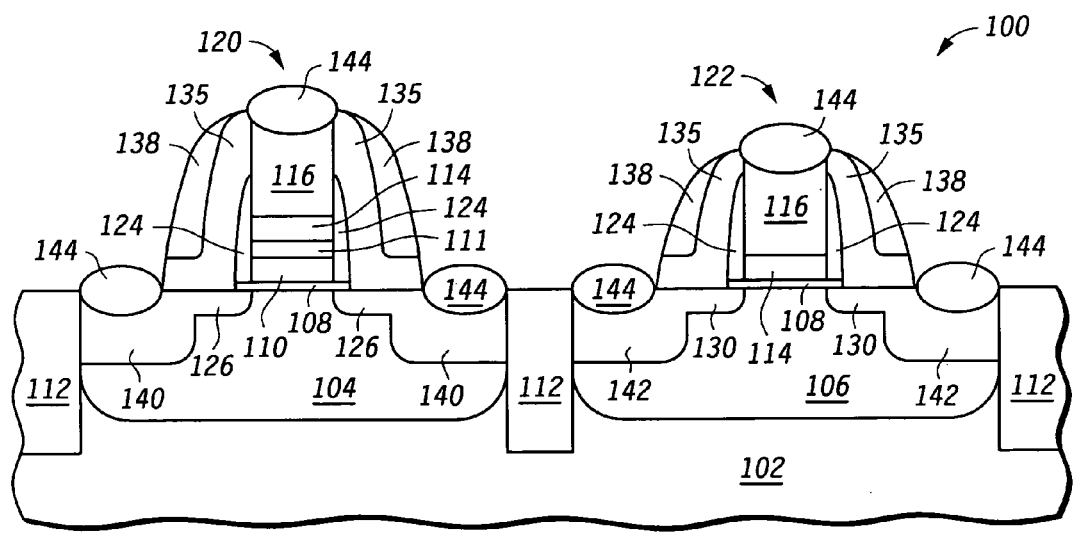
FIG. 7 is a processing step subsequent to FIG. 6 in which the thin oxide layer is removed over the gates and source/drain regions, and these regions are subsequently salicided to form a substantially completed device.

Now in reference to FIG. 7, an anneal is next performed to diffuse the extension and source/drain regions to the desired profile and to activate the dopants. Again, this is done using conventional practices. Thereafter, remaining portions of the oxide liner 134 are removed from unprotected regions of the device (e.g. from above the source/drain regions, the gates, and the isolation regions) using a conventional wet etch. The exposed source/drain regions and gates are then silicided using a self-aligned process by, for example, depositing a blanket layer of titanium, cobalt or nickel and thermally reacting this metal with the adjacent silicon regions to form silicide regions 144 as shown in FIG. 7. Thus, there is little deleterious effect in using a silicon containing cap over first gate 120 and second gate 122 from a resistance perspective because the silicidation process used to silicide the source/drain regions can be used to silicide the gate at the same time for satisfactory resistance levels. Resistance can be further reduced by completely siliciding the silicon containing layer 116 in the gate stack provided the silicided regions above the source/drain regions and the source/drain regions themselves are adjusted as may be needed.

Figure 8:
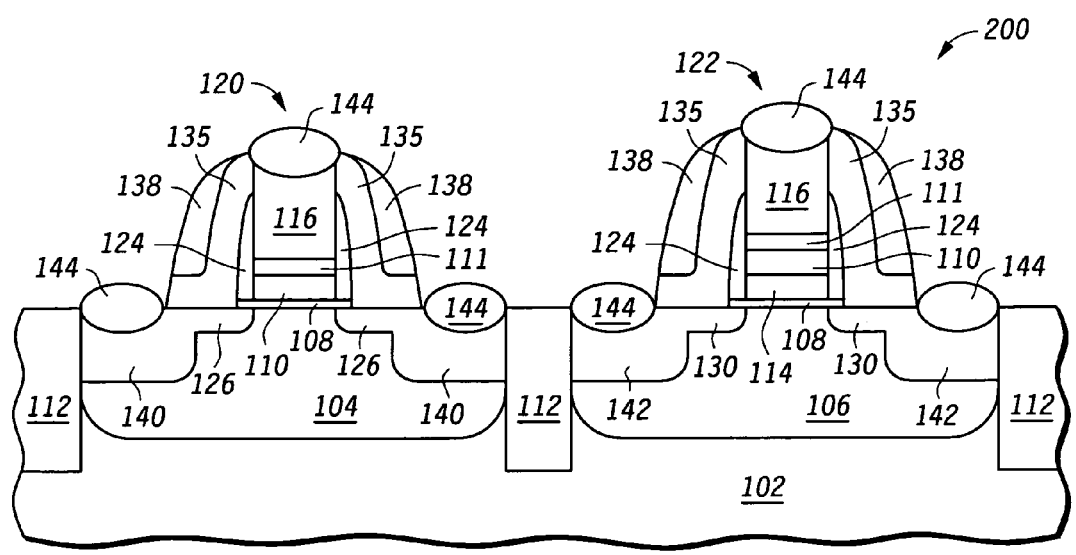
FIG. 8 illustrates a cross-section of semiconductor device is accordance with another embodiment of the present invention.

FIG. 8 illustrates a cross-section of semiconductor device 200 is accordance with another embodiment of the present invention. Semiconductor device 200 is the similar to the semiconductor device 100 except that in semiconductor device 200, the metal layers are deposited for the NMOS transistor before the metal layers are deposited for the PMOS transistor. The reference numbers are the same and the process steps are similar as discussed above for FIG. 1–7.

At this point the dual metal gate device is substantially complete. As one of ordinary skill in the art will recognize and appreciate, various interlayer dielectrics and metal inconnects are subsequently formed to route the various transistors in accordance with the device design. Bond pads and passivation layers are then added and the individual integrated circuits are tested, singulated, and packaged for final distribution.

By now it should be apparent that there has been providing a dual metal gate structure for use in a CMOS process which overcomes the problems previously described. More specifically, the present invention provides a reliable method for forming a dual gate metal structure using a gate electrode formed from a conductive metal oxide. Oxygen migration from the conductive metal oxide to a subsequent layer is prevented by forming an oxidation resistant barrier layer over the conductive metal oxide. In addition, the formation of an additional insulating layer between the conductive metal oxide and the subsequent layer is prevented. Changes to the work function of the conductive metal oxide gate electrode are also avoided because the barrier layer prevents oxygen loss from the conductive metal oxide gate electrode.

In the foregoing specification, the invention has been described with reference to specific embodiments. However, one of ordinary skill in the art appreciates that various modifications and changes can be made without departing from the scope of the present invention as set forth in the claims below. For example, although the invention has been described with respect to specific conductivity types or polarity of potentials, skilled artisans appreciated that conductivity types and polarities of potentials may be reversed. Additionally, the invention can be extended to form three or more gate stacks with different metal gate materials. For example, in addition to having a gate stack which includes one metal capped with a silicon containing layer and a gate stack which includes two metals capped with a silicon containing layer, there could be a third gate stack which includes three metals capped with a silicon containing layer. The third gate stack may be advantageous for forming the input/output transistors of a device that typically have higher threshold voltage requirements than logic transistors. The third gate stack could be achieved by depositing and patterning the first metal layer, as shown in FIG. 2, then depositing a second metal and patterning it similarly over the area for the second gate stack. Depositing the third metal layer and the silicon containing capping layer is next as shown in FIG. 3. This can further be extended similarly to form a fourth gate stack, a fifth gate stack, etc. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming a semiconductor device comprising:
   providing a semiconductor substrate, wherein the semiconductor substrate has a first region;
   forming a gate dielectric over the first region;
   forming a conductive metal oxide over the gate dielectric;
   forming an oxidation resistant barrier layer over the conductive metal oxide;
   forming a capping layer over the oxidation resistant barrier layer;
   patterning the conductive metal oxide, oxidation resistant barrier layer, and the capping layer to form a gate having a sidewall, the sidewall extending away from the semiconductor substrate; and
   forming a spacer on the sidewall, the spacer extending over an edge of each of the patterned conductive metal oxide, patterned oxidation resistant barrier layer, and the patterned capping layer.

2. The method of claim 1, wherein the first region is doped n-type.

3. The method of claim 2, wherein the conductive metal oxide forms at least a part of a PMOS gate electrode.

4. The method of claim 2, wherein:
   the semiconductor substrate comprises a second region;
   the second region is doped p-type; and
   the forming the semiconductor device further comprises forming an NMOS gate electrode material over the oxidation resistant barrier layer and under the capping layer.

5. The method of claim 4, wherein forming the NMOS gate electrode further comprises forming a material selected from the group consisting of TaC and TaSiN.

6. The method of claim 1, wherein the forming the conductive metal oxide further comprising forming the conductive metal oxide comprising an element selected from the group consisting of Ir, Mo, Ru, W, Os, Nb, Ti, V, Ni, and Re.

7. The method of claim 6, wherein the forming the oxidation resistant barrier layer further comprises forming TiN.

8. The method of claim 1, wherein the forming the capping layer further comprises forming a polysilicon layer.

9. The method of claim 1, wherein forming the oxidation resistant barrier layer occurs before annealing the semiconductor substrate.

10. A method for forming a semiconductor device comprising:
- providing a semiconductor substrate, wherein the semiconductor substrate has a first region and a second region, and the first region has a different dopant than the second region;
- forming a gate dielectric over the first region and the second region;
- forming a conductive metal oxide over the gate dielectric in the first region;
- forming an oxidation resistant barrier layer over the conductive metal oxide in the first region;
- forming a conductive material over the gate dielectric in the second region and forming the conductive material over the oxidation resistant barrier layer in the first region;
- forming a capping layer over the conductive material;
- patterning the conductive metal oxide, oxidation resistant barrier layer, the conductive material, and the capping layer in the first region to form a gate having a sidewall, the sidewall extending away from the semiconductor substrate; and
- forming a spacer on the sidewall, the spacer extending over an edge of each of the patterned conductive metal oxide, patterned oxidation resistant barrier layer, the patterned conductive material, and the patterned capping layer.

11. The method of claim 10, wherein the first region is doped n-type and the second region is doped p-type.

12. The method of claim 10, wherein the conductive metal oxide forms at least a part of a P-MOS gate electrode and the conductive material forms at least a part of an N-MOS gate electrode.

13. The method of claim 10, wherein forming the conductive material further comprises forming a material selected from the group consisting of TaC and TaSiN.

14. The method of claim 10, wherein the forming the conductive metal oxide further comprising forming the conductive metal oxide comprising an element selected from the group consisting of Ir, Mo, Ru, W, Os, Nb, Ti, V, Ni, and Re.

15. The method of claim 10, wherein the forming the oxidation resistant barrier layer further comprises forming TiN.

16. The method of claim 10, wherein forming the oxidation resistant barrier layer occurs before annealing the semiconductor substrate.

17. A semiconductor device comprising:
- a semiconductor substrate, wherein the semiconductor substrate has a first region;
- a gate dielectric over the first region;
- a patterned conductive metal oxide over the gate dielectric;
- a patterned oxidation resistant barrier layer over the patterned conductive metal oxide; and
- a patterned capping layer over the patterned oxidation resistant barrier layer, wherein the patterned conductive metal oxide, the pattern oxidation resistant barrier layer, and the patterned capping layer for a gate having a sidewall extending from the semiconductor substrate; and
- a spacer formed over the sidewall.

18. The semiconductor device of claim 17, wherein
the conductive metal oxide comprises an element selected from the group consisting of Ir, Mo, Ru, W, Os, Nb, Ti, V, Ni, and Re; and the oxidation resistant barrier layer comprises titanium and nitrogen.

* * * * *